United States Patent
Broder et al.

[19]

[11] Patent Number: 6,061,234
[45] Date of Patent: May 9, 2000

[54] SECURED SNAP-ON COVER FOR A COMPUTER SYSTEM DOCKING STATION

[75] Inventors: Damon Broder, Austin; Cassius J. Mullen, Round Rock; Jefferson Blake West, Austin, all of Tex.

[73] Assignee: Dell U.S.A., L.P., Round Rock, Tex.

[21] Appl. No.: 09/270,492

[22] Filed: Mar. 15, 1999

[51] Int. Cl.[7] .............................. G06F 1/16; H05K 5/02
[52] U.S. Cl. ..................... 361/686; 361/683; 439/638
[58] Field of Search .................................. 361/686, 727, 361/683, 726, 679, 725, 732, 740, 747, 685, 731; 70/33, 38 R; 395/186; 332/332.1, 333; 292/137; 439/638, 928; 312/223.2; 364/708.1; G06F 1/16

[56] References Cited

U.S. PATENT DOCUMENTS

| | | |
|---|---|---|
| 4,672,510 | 6/1987 | Castner ................................. 361/415 |
| 5,323,291 | 6/1994 | Boyle et al. . |
| 5,347,425 | 9/1994 | Herron et al. . |
| 5,446,618 | 8/1995 | Tetsuya et al. . |
| 5,450,271 | 9/1995 | Fukushima et al. ................. 361/686 |
| 5,477,415 | 12/1995 | Mitcham et al. ................... 361/686 |
| 5,526,226 | 6/1996 | Katoh et al. . |
| 5,535,093 | 7/1996 | Noguchi et al. .................... 361/686 |
| 5,557,562 | 9/1996 | Yoshiharu et al. ................ 364/708.1 |
| 5,568,359 | 10/1996 | Cavello et al. ..................... 361/686 |
| 5,580,182 | 12/1996 | Lin ....................................... 403/325 |
| 5,619,398 | 4/1997 | Harrison et al. ................... 361/686 |
| 5,687,061 | 11/1997 | Mesfin et al. ...................... 361/686 |
| 5,694,292 | 12/1997 | Paulsel et al. ..................... 361/686 |
| 5,699,226 | 12/1997 | Cavello ............................... 361/686 |
| 5,737,185 | 4/1998 | Morrison et al. . |
| 5,737,541 | 4/1998 | Shimizu et al. ................... 395/281 |
| 5,764,481 | 6/1998 | Ruch et al. . |
| 5,768,101 | 6/1998 | Cheng ................................. 361/687 |
| 5,784,253 | 7/1998 | Ooka et al. ........................ 361/686 |
| 5,790,375 | 8/1998 | Lee ..................................... 361/686 |
| 5,812,356 | 9/1998 | O'Connor . |
| 5,838,539 | 11/1998 | Doss et al. ......................... 361/686 |
| 5,864,294 | 1/1999 | Hsu et al. ........................... 340/635 |
| 5,870,283 | 2/1999 | Maeda et al. ...................... 361/686 |
| 5,921,697 | 7/1999 | Karl et al. .......................... 403/181 |
| 5,924,878 | 7/1999 | Lan et al. ........................... 439/136 |
| 5,933,321 | 8/1999 | Ruch et al. ......................... 361/686 |
| 5,933,322 | 8/1999 | Ruch et al. ......................... 361/686 |
| 5,948,074 | 9/1999 | Ninomiya .............................. 710/2 |
| 5,959,835 | 9/1999 | Dohi et al. ......................... 361/686 |

FOREIGN PATENT DOCUMENTS

| | | | |
|---|---|---|---|
| 7-94876 | 7/1995 | Japan .......................... H05K 5/02 |
| 7-271473 | 10/1995 | Japan ........................... G06F 1/16 |
| 9-269848 | 10/1997 | Japan ........................... G06F 1/16 |

*Primary Examiner*—Leo P. Picard
*Assistant Examiner*—Anatoly Vortman
*Attorney, Agent, or Firm*—Haynes & Boone, L.L.P.

[57] ABSTRACT

A docking station for a computer system includes a tray having a support surface for supporting the computer system, and an undersurface opposite the support surface. The tray includes a plurality of openings formed therein connecting the support surface and the undersurface. A housing cover includes a security device extending therefrom for engagement with the computer system. A housing cover is mounted on the support surface and includes a plurality of snap tabs and a receiver extending through the openings and terminating adjacent the undersurface. A latching device is mounted adjacent the undersurface. A protrusion member is adjacent the undersurface and is connected for movement with the latching device into and out of engagement with the receiver.

20 Claims, 7 Drawing Sheets

SECURED SNAP-ON COVER FOR A COMPUTER SYSTEM DOCKING STATION

BACKGROUND

The disclosures herein relate generally to computers and more particularly to a method and apparatus for providing security for a docking station and a computer latched to the docking station.

Port replicators are docking devices which attach to the back of a portable notebook computer via a single docking connector. Replicators have several other connectors which remain connected to various cables, e.g. printer, power, video, etc. In this manner, a notebook computer can pass standard I/O signals to peripheral devices via the port replicator without the need to make all of the cable connections directly to the notebook computer. Thus, the user of the notebook computer can quickly engage and disengage the notebook computer from the replicator. Docking stations are docking devices similar to port replicators but offer more features and functions and are therefore physically larger in size than port replicators.

There are various methods of interconnecting notebook computers with port replicators and docking stations. Some models merely plug in. Others include mechanical assist devices, i.e. ejectors, to urge the interconnected plugs apart to overcome the gripping effect of the male-female connection. Still others include interlatching devices for security purposes thus providing both an electrical-mechanical plug connection and a security latching device.

Because of the small size of notebook computers, the port replicators and the docking station, and the ease of engaging and disengaging the notebook computers, theft of each of these devices is not only possible, but quite common. To avoid such theft, several lock-type security measures have been devised. These devices typically include a padlock and a lock cable which tether the computer, or the computer and the associated docking device, to a table or to the user's desk.

Some current docking stations are formed of two main assemblies; a housing and a tray. The housing has a cover secured to the tray by four screws engaged with the underside of the tray. As part of a security solution to prevent access to the eject mechanism, the housing assembly attaches to the top of the tray with a thumbscrew which is installed from the bottom of the tray. While this arrangement guards access to the eject mechanism when the docking station is secured to a desktop, the thumbscrew adds a step to the manufacturing process because the entire device must be inverted 180° to install the thumbscrew. This also adds cost and complexity to the product and its manufacturability.

U.S. Pat. No. 5,323,291 discloses a fully functional portable computer with a central processing unit, hard disk drive data storage, liquid crystal display, a docking station having at least a floppy disk drive, video random access memory and video controller. A motorized docking/undocking mechanism automatically docks and undocks the portable computer and docking station after the user has inserted the portable computer into the docking station or after the user has requested that the units be undocked. Numerous mechanical and electrical safeguards prevent the docking and undocking of the units if such docking or undocking is likely to lead to the loss of data or damage to the components of either unit. The internal mechanical construction of the docking station allows the user to place a large cathode ray tube display monitor directly atop the docking station without hindering the docking or undocking of the portable computer.

U.S. Pat. No. 5,347,425 discloses a housing for a docking station for use with a portable computer. The docking station provides the portable computer with increased display and data storage capabilities. In use, a portable computer is inserted into the docking slot of the docking station. Additionally, a large cathode ray tube display is placed on top of the housing for the docking station in a typical user scenario. As docking and undocking must not be hindered by the presence of a large display on top of the housing for the docking station, the housing is provided with internally mounted cross beams that distribute the weight of the display around a computer supporting skeleton and through a set of support columns into the surface the housing for the docking station to rest upon. This reinforcing cross beams and columns structure allows the housing for the docking station to support without deformation relatively large displays without being excessive in weight of size.

In U.S. Pat. No. 5,764,481, a computer docking station has a disk drive module incorporated therein which is capable of operatively receiving a disk drive. The disk drive module is also capable of being operatively installed within a desktop computer or other enclosure having a half-height bay therein. Security features of the docking station include preventing access by unauthorized persons to the disk drive, and preventing ejection of the disk drive from the disk drive module. Additionally, multiple disk drive modules may be cooperatively linked in the docking station so that the security features relating to each of the disk drive modules may be simultaneously actuated.

U.S. Pat. No. 5,812,356 discloses a method and apparatus for electromechanically locking a docking station to a computer using an electromagnetic attractive force. The docking station includes a latching mechanism with a ferromagnetic handle, and an electromagnet proximately located to the latching mechanism. The latch mechanically secures the docking station to the PC. The electromagnet is positioned such that, when electrically energized, the electromagnetic field produced thereby attracts the handle with sufficient force to prevent the handle from being used to disconnect the PC from the docking station. Alternatively, the electromagnet can be located in the docking station so that it is near a ferromagnetic plate in the PC when the PC is docked. The electromagnet is positioned such that, when electrically energized, the electromagnetic field produced thereby attracts the plate with sufficient force so as to physically lock the plate to the electromagnet, thereby locking the PC to the docking station.

Therefore, what is needed is a docking device which avoids limitations associated with prior devices and which includes a top down assembly scheme for such docking stations, dispenses with the 180° inverted step for installing the thumbscrew, and also avoids the need for the four screws used to secure the housing cover to the tray.

SUMMARY

One embodiment, accordingly, provides security for a docking station and for a computer latched to the docking station. To this end, a docking station includes a tray having a surface for supporting a computer and an opening formed through the surface. A housing cover is mounted on the surface of the tray. The housing includes a receiver extending through the opening. A latching device mounted in the tray, includes a protrusion which is movable for engaging and releasing the receiver.

A principal advantage of this embodiment is that it eliminates parts, simplifies assembly, provides a cost savings and improves the design for manufacture aspects of top down assembly.

DETAILED DESCRIPTION

Figure 1:
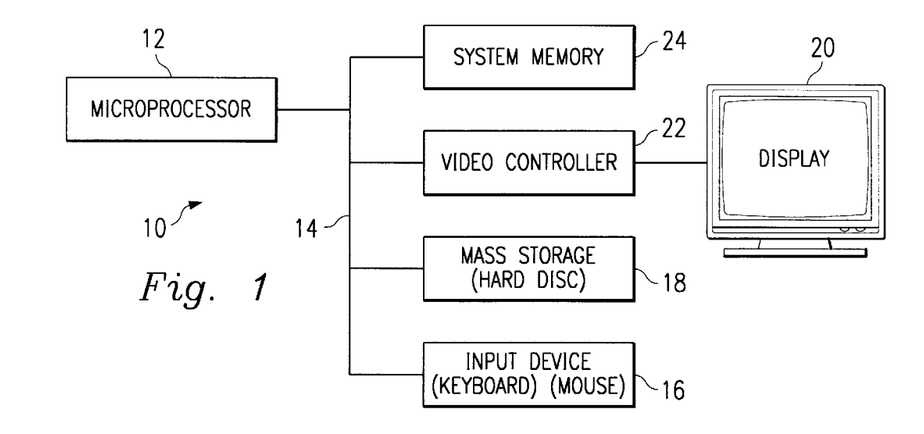
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 10 by a video controller 22. A system memory 24 is coupled to microprocessors 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
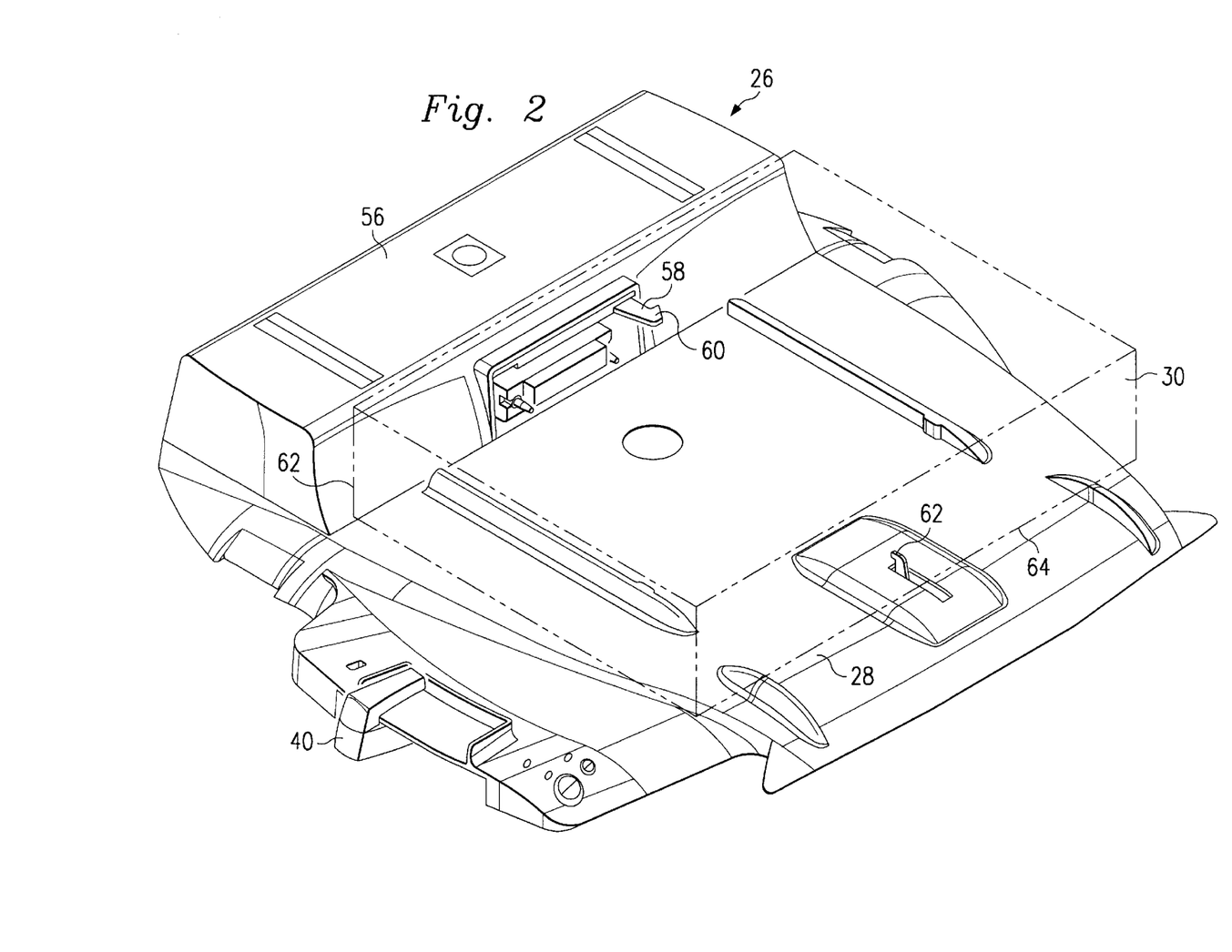
FIG. 2 is an isometric view illustrating an embodiment of a docking station.
Figure 3:
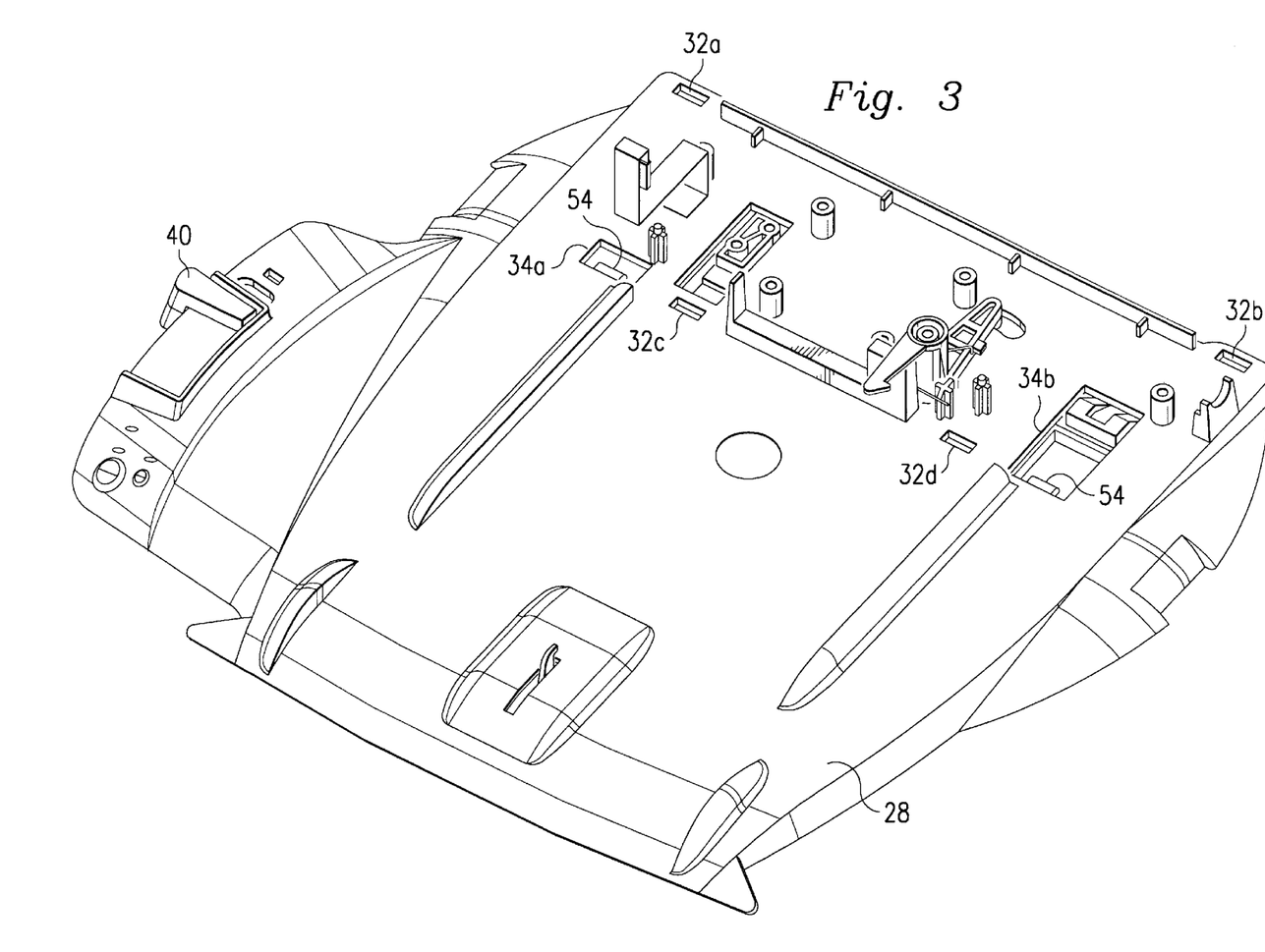
FIG. 3 is an isometric partial view illustrating an embodiment of a support surface of the docking station.
Figure 4:
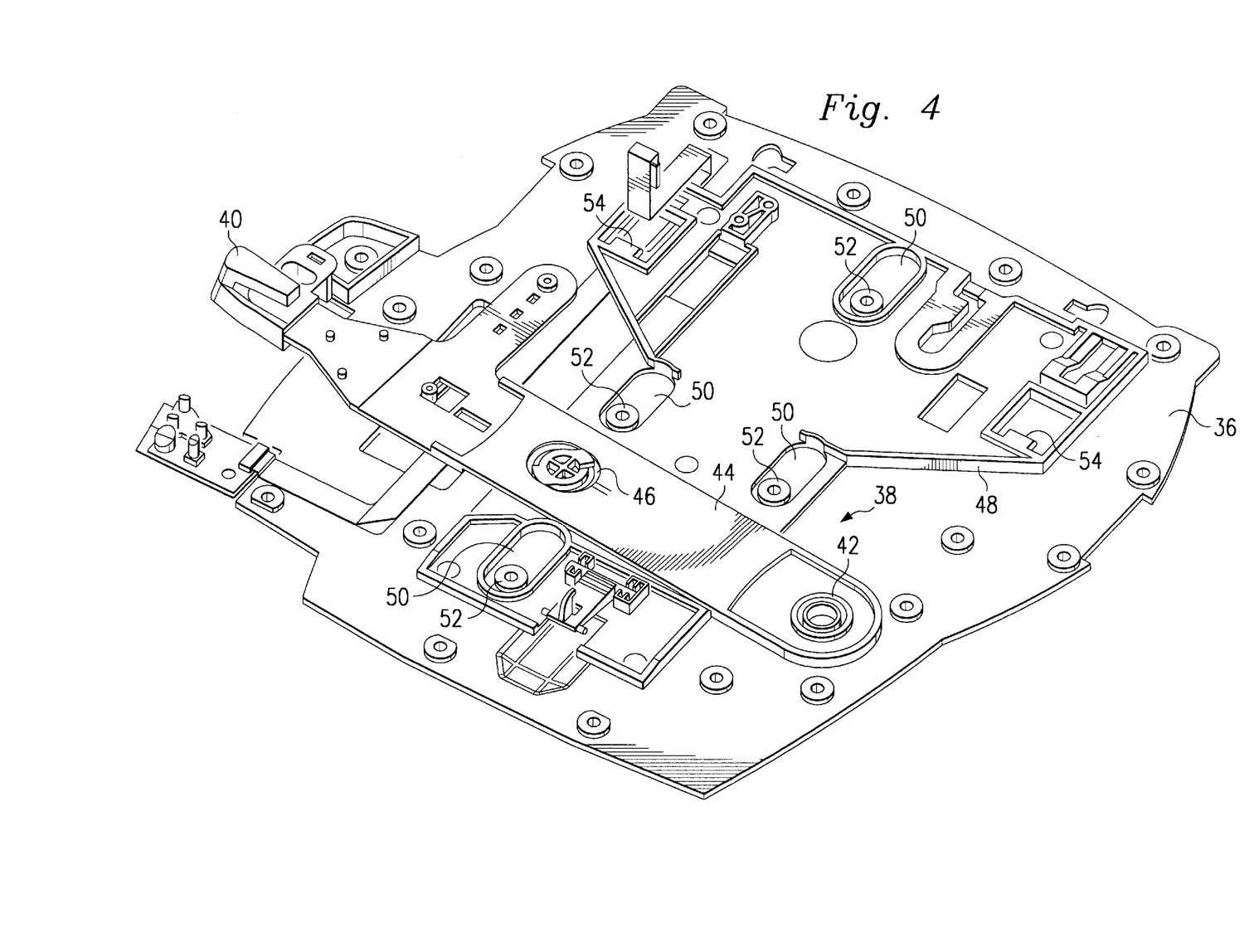
FIG. 4 is an inverted isometric view illustrating an embodiment of an undersurface of the docking station.

A docking station 26, FIG. 2, includes a surface 28 for supporting a computer 30 which includes the computer system of FIG. 1. A plurality of openings 32a, 32b, 32c, 32d, 34a, 34b, FIG. 3 are formed through the surface 28. An undersurface 36, FIG. 4, is opposite the support surface 28. The openings 32a–d, 34a–b, FIGS. 3 and 4, extend from the support surface 28 to the undersurface 36, and are provided for receiving a plurality of tabs and a plurality of receivers to extend therethrough as will be discussed below.

Figure 5:
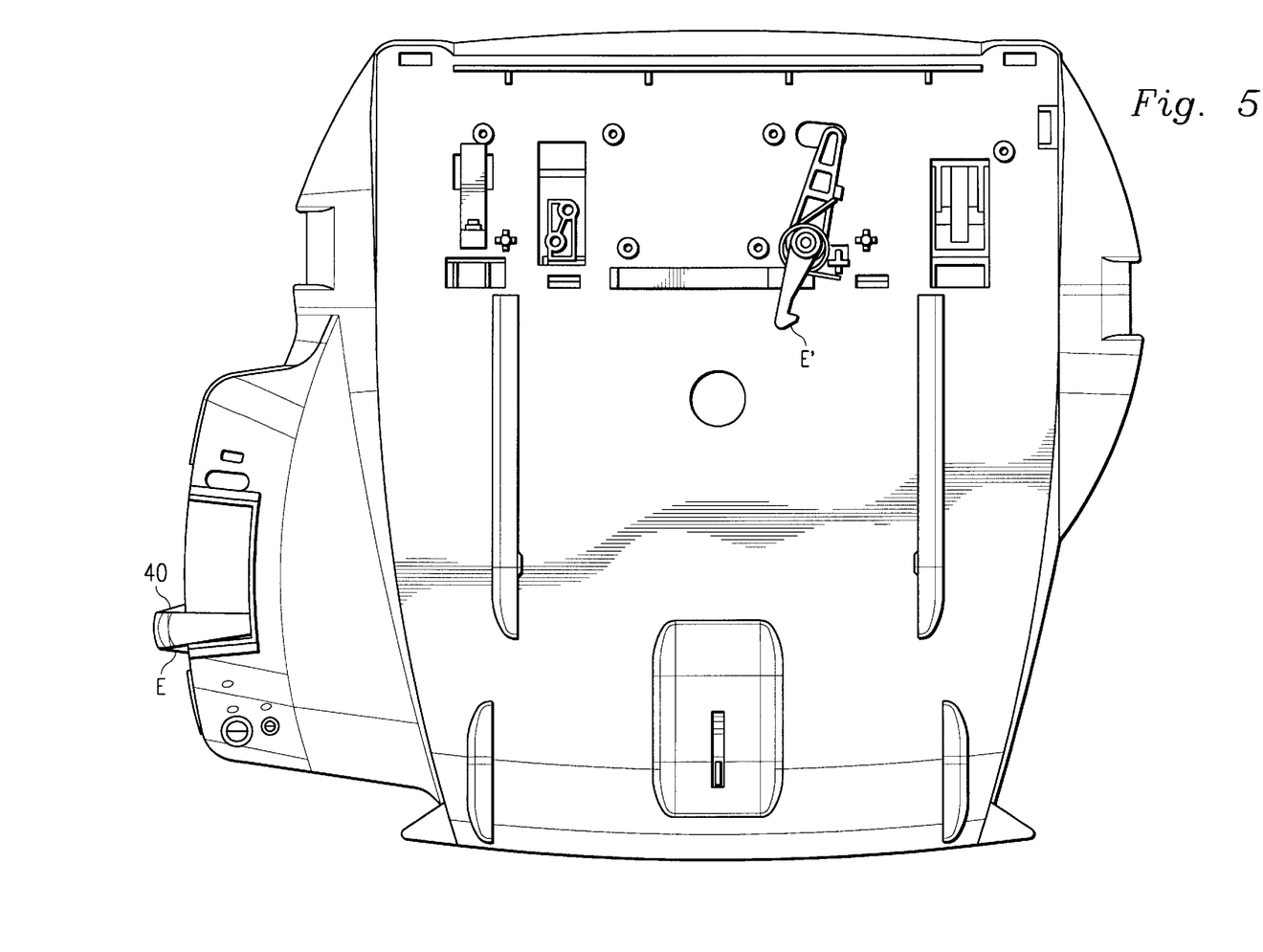
FIG. 5 is a partial plan view illustrating an embodiment of the support surface of the docking station including a handle and security device in an eject position.
Figure 6:
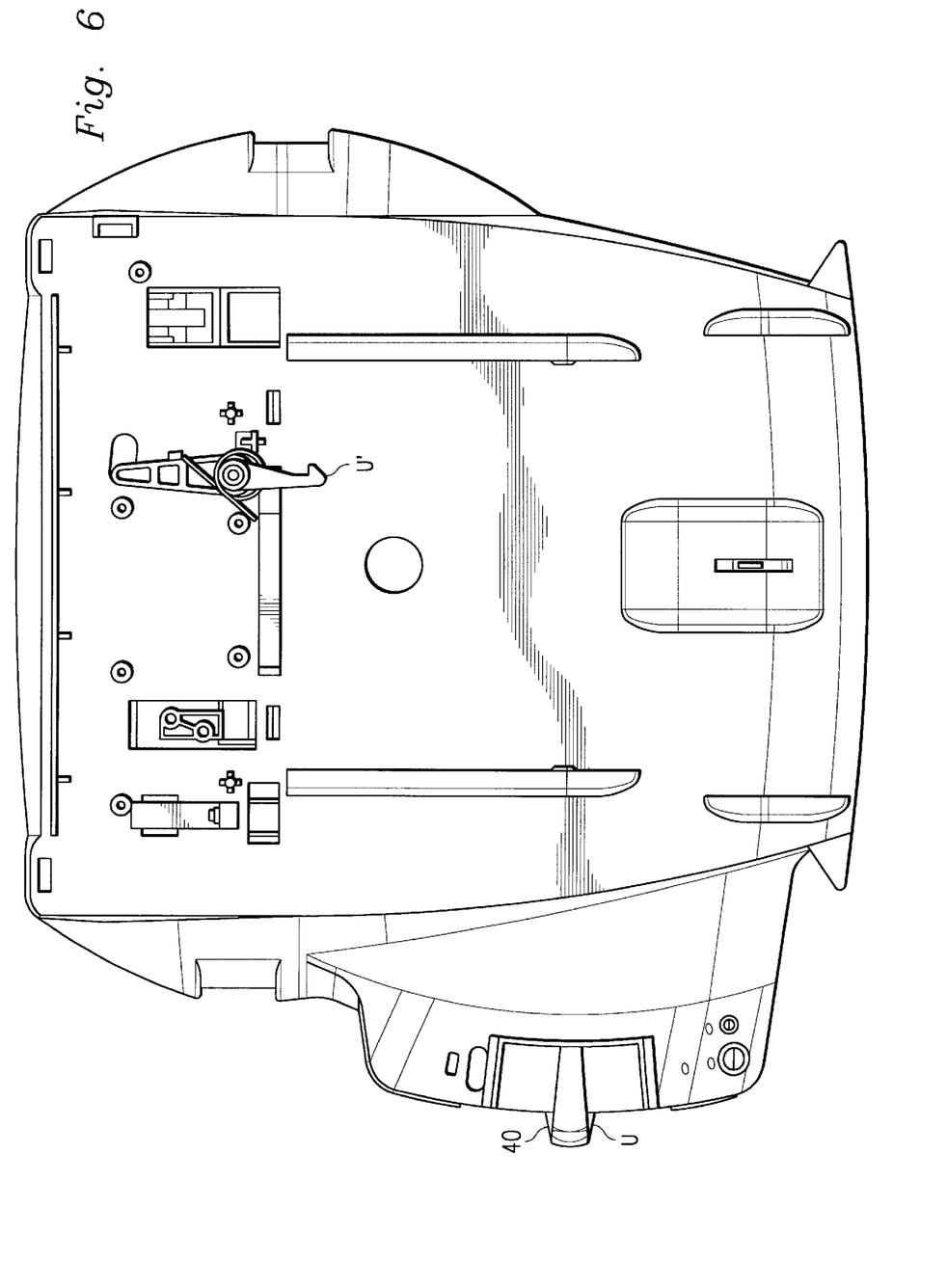
FIG. 6 is a partial plan view illustrating an embodiment of the support surface of the docking station including the handle and security device in an unlock position.
Figure 7:
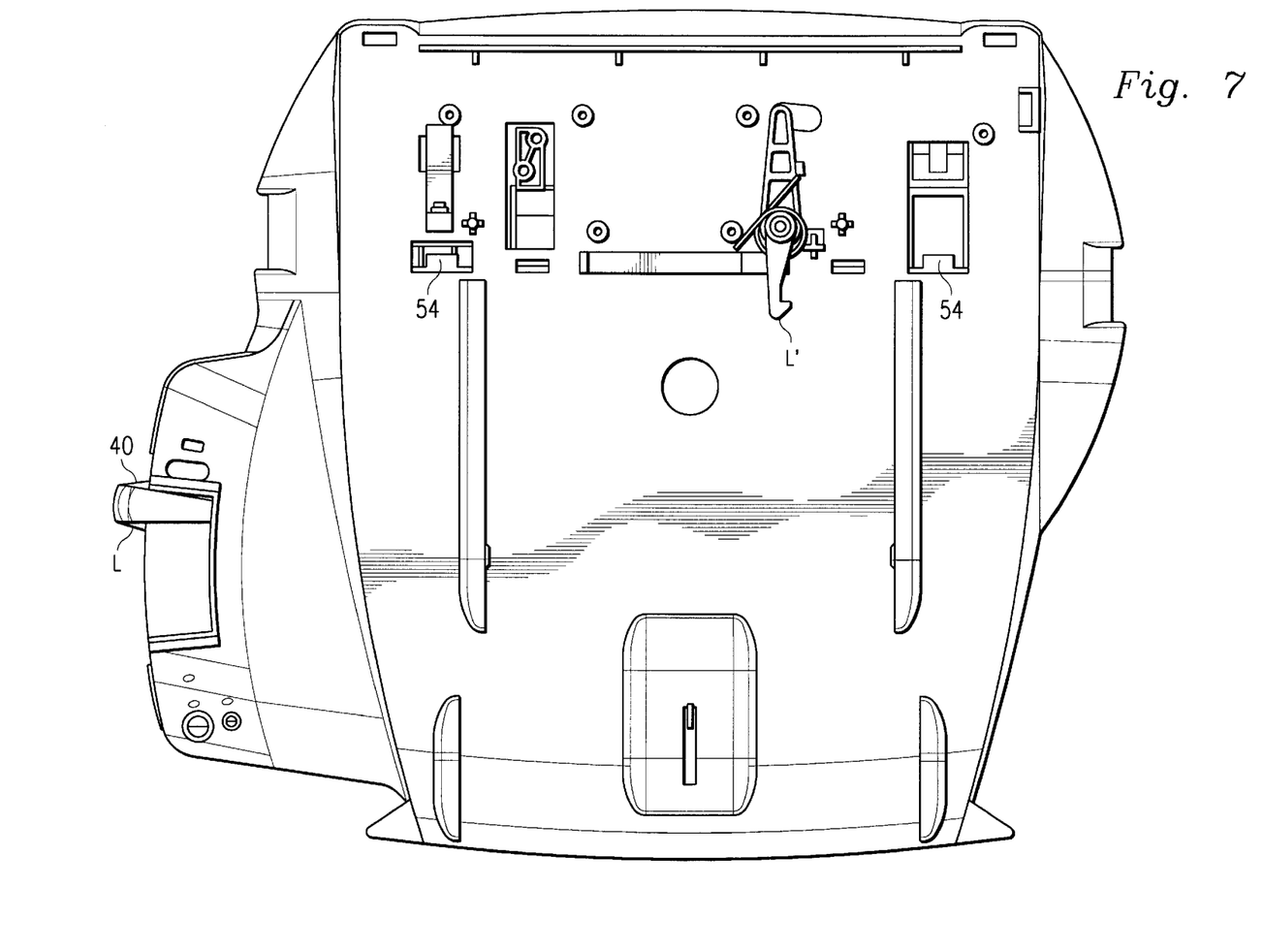
FIG. 7 is a partial plan view illustrating an embodiment of the support surface of the docking station including the handle and security device in a lock position.

Attached to the underside 36, FIG. 4, is a latching device 38 including a handle 40 pivotally mounted at a connection 42 on the undersurface 36. An arm 44 which interconnects the handle 40 and the pivotal connection 42, is connected at a coupling 46 to move a latch slide 48 which is guided by the engagement of a plurality of slots 50 formed therein and a plurality of coupled slot guides 52. A pair of protrusions 54 formed on the latch slide 48, move therewith adjacent the undersurface 36, when the slide 48 is moved in response to movement of the handle 40. The protrusions 54, FIGS. 3 and 4, are also adjacent the receiver openings 34a–b. The handle 40 is movable between an eject position E, FIG. 5, and unlock position U, FIG. 6, and a lock position L, FIG. 7.

A housing cover 56 is mounted on the support surface, 28, FIG. 2. A printed circuit board (not shown) and a security device 58 are mounted in the housing cover 56. The security device 58 is connected to the latching device 38 and includes a hook mechanism 60 for engagement with a rear surface 62 of the computer 30, such as a portable computer, to secure the portable computer 30 to the docking station 26. The hook 60 moves in response to the handle 40 to a correlated eject position E', FIG. 5, an unlock position U', FIG. 6, and a lock position L', FIG. 7. A second hook 62, FIG. 2, also moves with the handle 40 to engage an underside 64 of the computer 30.

Figure 8:
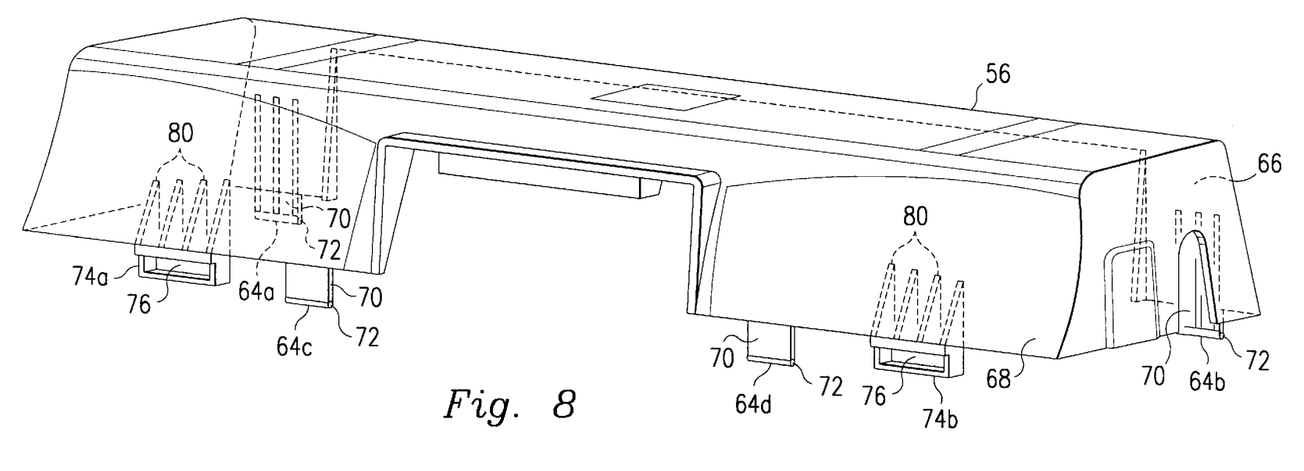
FIG. 8 is an isometric view illustrating an embodiment of the housing cover.

The housing cover 56, FIG. 8, includes a plurality of tabs 64a, 64b, 64c, 64d, extending therefrom for engagement with the tab openings 32a–d, formed in the support surface 28, FIG. 3. A pair of the tabs 64a–b, FIG. 8, are positioned on one side 66 of the housing cover 56 and another pair of the tabs 64c–d, are positioned on an opposite side 68 of the housing cover 56. The tabs 64a–d, are connected to the housing cover 56 by flexible arms 70 so that the tabs 64a–d can be flexed for snapping into and out of engagement with the tab openings 32a–d, support surface 28 as stated above. A hook 72 on each tab 64a–d, is provided to engage the undersurface 36.

The housing cover 56, FIG. 8, also includes a plurality of receivers 74a, 74b, for extending from the housing cover 56 adjacent the tabs 64c–d, respectively, and through the receiver openings 34a–b, respectively, FIG. 3. Each receiver 74a–b, FIG. 8, extends to expose a slot 76 formed therein and positioned adjacent the undersurface 36, FIG. 4, for engaging the protrusions 54 in response to movement of the handle 40 of the latching device 38 to the lock position L, FIG. 7. The receivers 74a–b, FIG. 8, are attached to the housing cover 56 by a plurality of reinforcement ribs 80.

In operation, the computer is seated on the docking station with the handle in the unlock position. The handle is moved to the lock position and the protrusions are moved to engage the slots of the receivers. When the computer is to be removed from the docking station, the handle is moved to the eject position and then returned to the unlock position. As a result, the protrusions are disengaged from the slots in the receivers.

During manufacture, the housing cover is secured to the support surface by aligning the tabs and the receivers with their respective openings. The tabs snap into the tab openings and snap into engagement with the undersurface. Removal of the housing cover for maintenance is easily accomplished due to the flexibility of the tabs and the housing cover.

As a result, one embodiment provides a docking station including a tray having a surface for supporting a computer and an opening formed through the surface. A housing cover is mounted on the surface of the tray and includes a receiver extending through the opening. A latching device is mounted within the tray and includes a protrusion movable for engaging and releasing the receiver.

Another embodiment provides a docking station for a computer system having a tray with a support surface for supporting a portable computer and an undersurface opposite the support surface. The tray includes a plurality of openings formed therein connecting the support surface and the undersurface. A housing cover is mounted on the support surface and includes a plurality of snap tabs and a receiver extending through the openings. A latching device is mounted adjacent the undersurface and includes a protrusion movable into and out of engagement with the receiver.

Another embodiment provides a computer system secured to a docking tray. The tray has a support surface for supporting the computer system and an undersurface, opposite the support surface. The tray includes a plurality of openings formed therein connecting the support surface and the undersurface. A housing cover includes a security device extending therefrom for engagement with the computer system. The housing cover is mounted on the support surface. A plurality of snap tabs and a receiver extend from the cover and through the openings to terminate adjacent the undersurface. A latching device is mounted adjacent the undersurface. A protrusion member adjacent the undersurface is connected for movement with the latching device into and out of engagement with the receiver.

A further embodiment provides a method of securing a computer system on a docking station by mounting a housing cover on a support surface of the docking station to cover a printed circuit board and a security device. A receiver on the housing cover extends through an opening formed in the support surface and terminates adjacent an opposite side of the support surface. A latch is mounted on the docking station coupled to the security device, and includes a protrusion movable into engagement with the receiver for securing the housing cover to the support surface.

As it can be seen, the principal advantages of these embodiments are that the docking device utilizes a one-piece tray with an integrated housing for the main PCB and eject mechanism. The housing has a cover which snaps over the PCB and the eject mechanism from the top via four snaps. Two snaps are on the front of the cover and two are on the back. For security, the cover includes two structural loops or receivers placed along the front edge of the cover adjacent two of the snaps. When the latching mechanism is moved to the locked position, two protrusions on the latching mechanism securely engage the loops and secure the cover to the tray thus protecting the PCB and the eject mechanism in the housing. As a result, there is no requirement to rotate the unit 180° during installation of the previously required thumbscrew. In addition, there is no requirement for the four screws and a plastic bottom housing part previously used. This results in less parts, a cost savings, and greatly improves the design for manufacture aspects of top down assembly.

Although illustrative embodiments have been shown and described, a wide range of modification, change and substitution is contemplated in the foregoing disclosure and in some instances, some features of the embodiments may be employed without the corresponding use of other features. Accordingly, it is appropriate that the appended claims be construed broadly and in a manner consistent with the scope of the embodiments disclosed herein.

What is claimed is:

1. A docking station comprising:
   a tray having a surface for supporting a computer and an opening formed through the surface;
   a housing cover mounted on the surface of the tray, the housing cover including a receiver extending through the opening; and
   a latching device mounted within the tray including a protrusion movable for engaging and releasing the receiver.

2. The docking station as defined in claim 1 further comprising a plurality of tabs extending from the housing cover.

3. The docking station as defined in claim 2 further comprising a plurality of slots formed in the tray for receiving the tabs.

4. The docking station as defined in claim 3 wherein the receiver includes a slot formed therein for engagement with the protrusion.

5. The docking station as defined in claim 4 wherein the receiver is adjacent one of the tabs.

6. The docking station as defined in claim 4 wherein the receiver includes reinforcement members connecting the receiver to the housing cover.

7. The docking station as defined in claim 4, further comprising an undersurface opposite the support surface.

8. The docking station as defined in claim 7 wherein the slot of the receiver is adjacent the undersurface.

9. The docking station as defined in claim 8 wherein the protrusion moves adjacent the undersurface.

10. A docking station for a computer system comprising:
    a tray having a support surface for supporting a portable computer and an undersurface opposite the support surface, the tray including plurality of openings formed therein connecting the support surface and the undersurface;
    a housing cover mounted on the support surface and including a plurality of snap tabs and a pair of receivers extending through the openings; and
    a latching device mounted adjacent the undersurface and including a pair of protrusions movable into and out of engagement with the receivers.

11. The docking station as defined in claim 10 wherein the snap tabs engage the undersurface.

12. The docking station as defined in claim 10 wherein the housing cover has multiple snap tabs on one side thereof and multiple snap tabs on another side thereof, opposite the one side.

13. The docking station as defined in claim 12 wherein the pair of receivers extend from the one side of the housing cover.

14. The docking station as defined in claim 13 wherein the pair of receivers are adjacent the multiple snap tabs on the one side of the housing cover.

15. The docking station as defined in claim 10 wherein the pair of receivers each include a slot formed therein for engagement with a respective one of the protrusions.

16. The docking station as defined in claim 15 wherein each slot is positioned adjacent the undersurface.

17. A computer system secured to a docking station comprising:
    a portable computer including the computer system;
    a tray having a support surface for supporting the portable computer, and an undersurface opposite the support surface, the tray including a plurality of openings formed therein connecting the support surface and the undersurface;
    a housing cover including a security device extending therefrom for engagement with the portable computer, the housing cover being mounted on the support surface and including a plurality of snap tabs and a receiver extending through the openings and terminating adjacent the undersurface;
    a latching device mounted adjacent the undersurface; and
    a protrusion member adjacent the undersurface and connected for movement with the latching device into and out of engagement with the receiver.

18. The computer system as defined in claim 17 wherein the receiver includes a slot formed therein for engagement with the protrusion.

19. The computer system as defined in claim 17 wherein the snap tabs include a hook for engagement with the undersurface.

20. A method of securing a computer system on a docking station comprising the steps of:

mounting a housing cover on a support surface of the docking station to cover a printed circuit board and a security device, a receiver on the housing cover extending through an opening formed in the support surface, and terminating adjacent an opposite side of the support surface;

mounting a latching device on the docking station, the latching device coupled to the security device and including a protrusion movable adjacent the opposite side; and moving the latching device to extend the protrusion into engagement with the receiver for securing the housing cover to the support surface.

* * * * *